US012796569B2

(12) United States Patent
Yung et al.

(10) Patent No.: US 12,796,569 B2
(45) Date of Patent: Nov. 10, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Yu Chieh Yung, Hsinchu City (TW); Chien-Fu Tseng, Taipei City (TW); Meng-Tsan Lee, Hsinchu (TW); Li-Han Hsu, Hsin-Chu City (TW); An-Jhih Su, Taoyuan City (TW); Wei-Cheng Wu, Hsinchu City (TW); Der-Chyang Yeh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 401 days.

(21) Appl. No.: 18/616,114

(22) Filed: Mar. 25, 2024

(65) Prior Publication Data

US 2025/0300154 A1 Sep. 25, 2025

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 74/01* (2026.01);
(Continued)

(58) Field of Classification Search
CPC ..... H10W 90/00; H10W 74/01; H10W 20/20; H10W 90/701; H10W 70/09; H10W 72/072; H10W 72/073; H10W 74/15; H10W 90/724; H10W 90/734; H10W 72/20; H10W 90/722; H10W 70/614; H10W 90/401; H10W 70/611; H10P 72/74; H10P 72/7424; H10P 72/7436
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Mamadou L Diallo
(74) *Attorney, Agent, or Firm* — JCIPRNET

(57) ABSTRACT

A manufacturing method of a semiconductor package includes: laterally covering a first die and a TIV with an insulating encapsulation, where the first die includes a semiconductor substrate and a TSV penetrating through the semiconductor substrate; recessing the semiconductor substrate, where the TSV protrudes above the semiconductor substrate; forming a patterned mask layer on the insulating encapsulation and the TIV, where the patterned mask layer exposes the semiconductor substrate and the TSV; forming a passivation material layer on the first die and the patterned mask layer, where a sidewall of the patterned mask layer is exposed by the passivation material layer; removing the patterned mask layer along with a portion of the passivation material layer on the patterned mask layer to expose the insulating encapsulation and the TIV; and removing an excess portion of the passivation material layer on the TSV to form a passivation layer laterally covering the TSV.

20 Claims, 14 Drawing Sheets

(51) Int. Cl.

| | |
|---|---|
| ***H10W 70/09*** | (2026.01) |
| ***H10W 72/00*** | (2026.01) |
| ***H10W 74/01*** | (2026.01) |
| ***H10W 74/15*** | (2026.01) |

(52) U.S. Cl.
CPC .......... *H10W 90/701* (2026.01); *H10W 70/09* (2026.01); *H10W 72/072* (2026.01); *H10W 72/073* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2019/0244947 | A1* | 8/2019 | Yu | H10P 72/74 |
| 2020/0020634 | A1* | 1/2020 | Tsai | H10P 72/74 |
| 2020/0343184 | A1* | 10/2020 | Fujishima | H10P 72/74 |
| 2021/0098421 | A1* | 4/2021 | Wu | H10P 72/74 |
| 2022/0308284 | A1* | 9/2022 | Liao | G02B 6/124 |
| 2023/0060720 | A1* | 3/2023 | Tsai | H10W 20/023 |
| 2024/0047332 | A1* | 2/2024 | Liu | H10W 20/20 |
| 2024/0047436 | A1* | 2/2024 | Liu | H10W 70/09 |
| 2024/0282661 | A1* | 8/2024 | Pan | H10D 48/366 |
| 2025/0125273 | A1* | 4/2025 | Lin | H03K 19/17744 |
| 2025/0157887 | A1* | 5/2025 | Huang | H10P 72/74 |
| 2025/0286026 | A1* | 9/2025 | Su | H10P 72/74 |
| 2026/0068745 | A1* | 3/2026 | Hung | H10W 76/17 |

* cited by examiner

SEMICONDUCTOR PACKAGE AND MANUFACTURING METHOD THEREOF

BACKGROUND

The semiconductor industry has experienced rapid growth due to continuous improvement in integration density of various electronic components. For the most part, this improvement in integration density has come from successive reductions in minimum feature size, which allows more components to be integrated into a given area. However, there are physical limitations to an achievable density in two-dimensional integrated circuits formation. As semiconductor technologies further advance, three-dimensional (3D) packages have emerged as an effective alternative to further reduce the physical size of integrated circuits. A through substrate via (TSV) penetrating through a substrate to electrically inter-couple features on opposite sides of the substrate is one of the techniques for implementing 3D packages. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
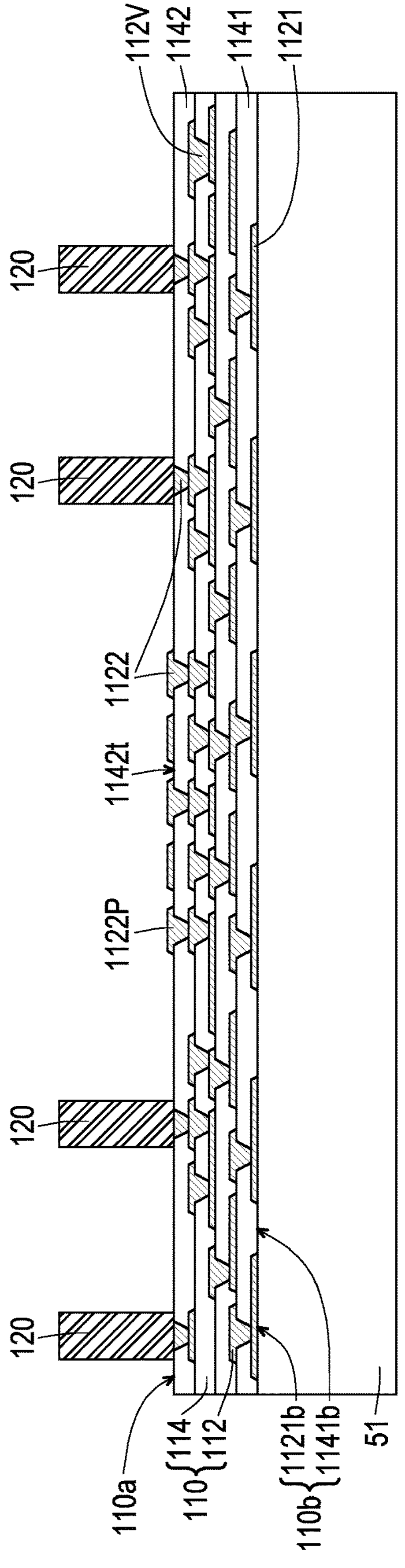
FIGS. 1-11 are schematic cross-sectional views of various stages of manufacturing a semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-11 are schematic cross-sectional views of various stages of manufacturing a semiconductor package, in accordance with some embodiments. Referring to FIG. 1, a first redistribution structure 110 may be formed over a temporary carrier 51. The temporary carrier 51 may be made of a material such as silicon, polymer, polymer composite, metal foil, ceramic, glass, glass epoxy, tape, or other suitable material for structural support. In some embodiments, the temporary carrier 51 is provided with an adhesive layer (not shown), and the first redistribution structure 110 is formed on the adhesive layer. For example, the adhesive layer is a light-to-heat-conversion (LTHC) coating layer or the like. The adhesive layer may be detached from the temporary carrier 51 by, e.g., projecting a light source on the temporary carrier 51 in a subsequent carrier de-bonding process. Other de-bonding method may be used depending on the material of the adhesive layer.

The first redistribution structure 110 may include one or more first patterned conductive layer(s) 112 formed in one or more first dielectric layer(s) 114. In some embodiments, the first dielectric layer 114 is formed of a polymer, such as polyimide (PI), polybenzoxazole (PBO), polyimide, benzocyclobutene (BCB), or any suitable dielectric material. In some embodiments, the first patterned conductive layer 112 includes conductive features (e.g., conductive lines, conductive vias, and conductive pads), and may be formed of one or more suitable conductive materials (e.g., copper, titanium, tungsten, aluminum, alloys, or the like). In some embodiments, the bottommost sublayer 1121 of the first patterned conductive layer 112 is formed over the temporary carrier 51. In some embodiments, the bottommost sublayer 1141 of the first dielectric layer 114 is formed over the temporary carrier 51 by using lithography and etching or other suitable processes, and covers the bottommost sublayer 1121 of the first patterned conductive layer 112. The steps of forming a sublayer of the first patterned conductive layer 112 and forming a sublayer of the first dielectric layer 114 may be repeated to form the first redistribution structure 110. It is noted that the number of sublayers of the first dielectric layer 114 and the first patterned conductive layer 112 construes no limitation in the disclosure. Other methods of forming the first redistribution structure 110 are possible and fully intended to be included within the scope of the disclosure.

With continued reference to FIG. 1, the first redistribution structure 110 may include a first surface 110*a* and a second surface 110*b* opposite to the first surface 110*a* and facing the temporary carrier 51. The respective conductive via 112V of the first redistribution structure 110 may be tapered from the first surface 110*a* toward the second surface 110*b*. The second surface 110*b* may include a surface 1141*b* of the bottommost sublayer 1141 of the first dielectric layer 114 and a surface 1121*b* of the bottommost sublayer 1121 of the first patterned conductive layer 112. The surfaces (1141*b* and 1121*b*) may be substantially leveled (e.g., coplanar) with each other, within process variations. For example, the topmost sublayer 1122 of the first patterned conductive layer 112 includes conductive pads 1122P formed on the top surface 1142*t* of the topmost sublayer 1142 of the first dielectric layer 114. The conductive pads 1122P on the top surface 1142*t* of the topmost sublayer 1142 may be or include under bump metallization (UBM) pads for further electrical connection.

Still referring to FIG. 1, conductive pillars 120 may be formed on the first surface 110*a* of the first redistribution structure 110. For example, the conductive pillars 120 are formed on the top surface 1142*t* of the topmost sublayer 1142 of the first dielectric layer 114 and physically and electrically connected to the topmost sublayer 1122 of the first patterned conductive layer 112. The conductive pillars 120 may be formed by: forming a seed layer; forming a patterned photoresist over the seed layer, where each of the openings of the patterned photoresist corresponds to one of the locations of the conductive pillars 120 to be formed; filling the openings of the patterned photoresist with an electrically conductive material such as copper using, e.g., plating or the like; removing the patterned photoresist using, e.g., an ashing or a stripping process; and removing portions of the seed layer on which the conductive pillars 120 are not formed. Other methods for forming the conductive pillars 120 are possible and fully intended to be included within the scope of the disclosure.

Figure 2:
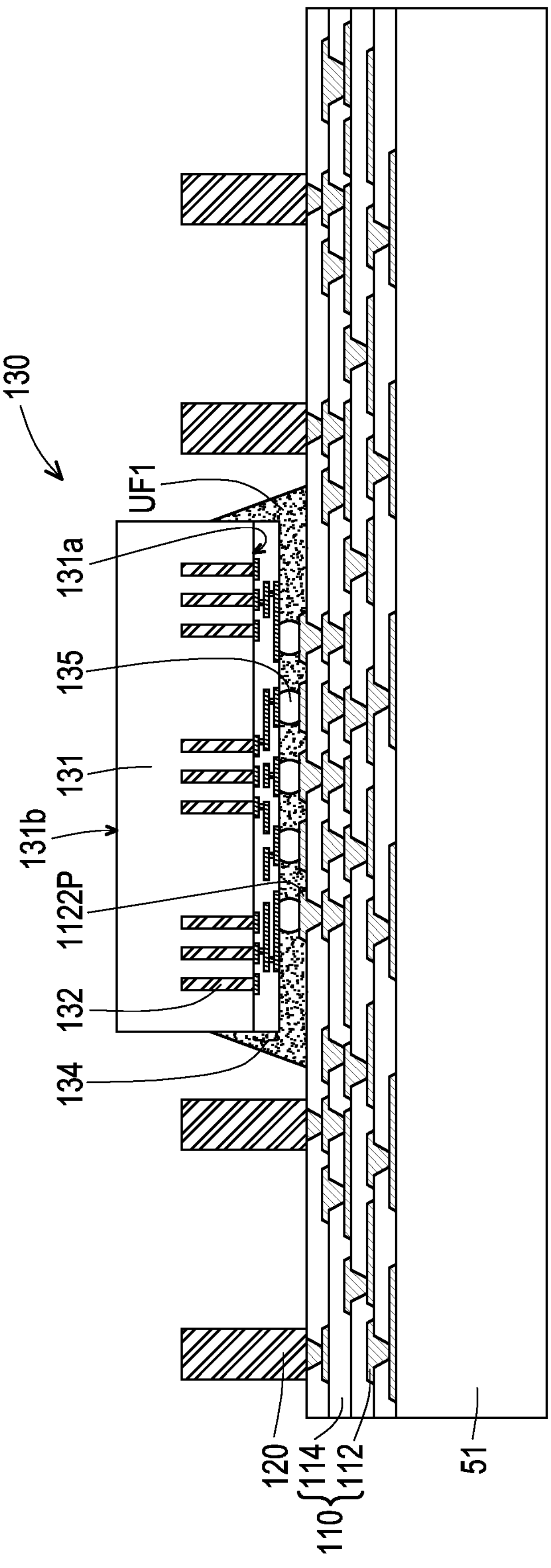

Referring to FIG. 2 and with reference to FIG. 1, a first die 130 may be disposed over the first surface 110*a* of the first redistribution structure 110 and electrically coupled to the first patterned conductive layer 112. The first die 130 may be surrounded by the conductive pillars 120. The first die 130 may be cut from a semiconductor wafer (not shown). The first die 130 may include a semiconductor substrate 131 including a front surface 131*a* and a back surface 131*b* opposite to the front surface 131*a*. The semiconductor substrate 131 may include an elementary semiconductor (e.g., silicon or germanium in a crystalline, a polycrystalline, or an amorphous structure, etc.), a compound semiconductor (e.g., SiC, GaAs, GaP, InP, InAs, InSb, etc.), an alloy semiconductor (e.g., SiGe, GaAsP, AlInAs, AlGaAs, GaInAs, GaInP, etc.), combinations thereof, or other suitable semiconductor materials. The first die 130 may include conductive vias 132 formed in the semiconductor substrate 131 and extending from the front surface 131*a* toward the back surface 131*b*. The conductive vias 132 may include one or more conductive materials (e.g., cobalt, titanium, tungsten, copper, aluminum, tantalum, titanium nitride, tantalum nitride, gold, silver, metal alloy, combinations thereof, etc.). For example, the respective conductive via 132 includes a seed layer, a dielectric liner separating the semiconductor substrate 131 from the seed layer, and a metallic layer plated in the semiconductor substrate 131 and overlying the seed layer. The details of the conductive via 132 are illustrated and described in FIG. 9.

With continued reference to FIG. 2, the first die 130 may include an interconnect structure 134 formed on the front surface 131*a* of the semiconductor substrate 131 and electrically coupled to the conductive vias 132. The interconnect structure 134 may include one or more interconnect wiring layer(s) embedded in one or more interconnect dielectric layer(s), where the interconnect wiring layers are electrically coupled to the conductive vias 132. In some embodiments, the first die 130 includes semiconductor devices (not shown) formed in/on the front surface 131*a* of the semiconductor substrate and electrically coupled to the interconnect structure 134. The semiconductor devices may be or include active devices (e.g., transistors, diodes, etc.) and/or passive devices (e.g., capacitors, resistors, inductors, etc.), or the like. Alternatively, the first die 130 is free of active devices and/or passive devices. The first die 130 may include first die connectors 135 electrically coupling the interconnect structure 134 to the first redistribution structure 110. The respective first die connector 135 may include one or more conductive material(s) such as solder, copper, aluminum, gold, nickel, silver, palladium, tin, the like, or a combination thereof. In some embodiments, the first die connectors 135 are solder bumps. In some embodiments, the respective first die connector 135 includes a metal pillar (e.g., a copper pillar) with or without a solder cap. The metal pillars may be solder-free and have substantially vertical sidewalls or tapered sidewalls.

In some embodiments, the first die connectors 135 are electrically and physically coupled to the conductive pads 1122P of the first redistribution structure 110. In some embodiments, a first underfill layer UF1 is formed in the gap between the first die 130 and the first redistribution structure 110 to surround the first die connectors 135 and the conductive pads 1122P for protection. In some embodiments, the first underfill layer UF1 extends upward to cover sidewalls of the first die 130. The first underfill layer UF1 may be or include any acceptable material, such as a polymer, epoxy, or the like, and may be formed by dispensing or any suitable deposition method. Alternatively, the first underfill layer UF1 is omitted. In some embodiments, the conductive pillars 120 are formed prior to the attachment of the first die 130. Alternatively, the first die 130 is coupled to the first redistribution structure 110 prior to the formation of the conductive pillars 120.

Figure 3:
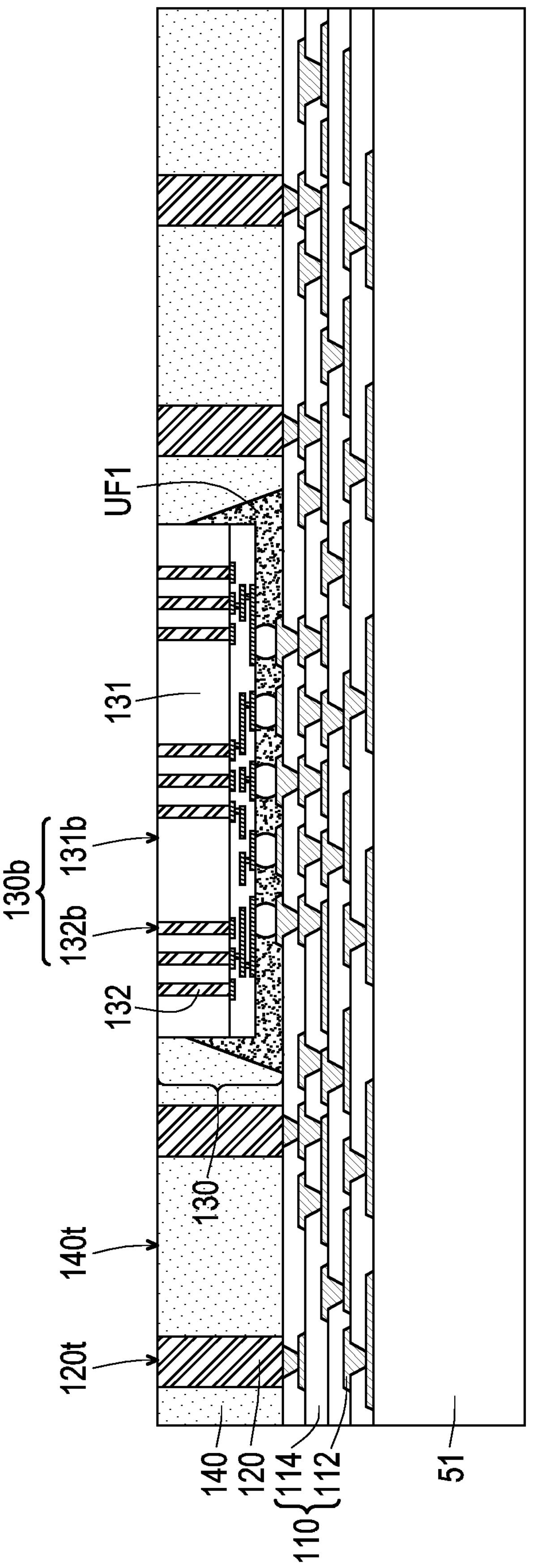

Referring to FIG. 3 and with reference to FIG. 2, a first insulating encapsulation 140 may be formed on the first surface 110*a* of the first redistribution structure 110 to cover the first die 130, the conductive pillars 120, and the first underfill layer UF1 (if exists). In some embodiments, the first insulating encapsulation 140 is a molding compound formed by a molding process. The first insulating encapsulation 140 may include a polymeric-based material (e.g., epoxy resins, silicon-containing resins, or the like), dielectric materials, or other suitable materials. In some embodiments, the first insulating encapsulation 140 is made of a molding underfill, and the first underfill layer UF1 may be replaced with the molding underfill material.

In some embodiments, a layer of insulating encapsulation material is formed to encapsulate the conductive pillars 120, the first die 130, and the first underfill layer UF1 (if exists). A planarization process (e.g., chemical mechanical polishing (CMP), mechanical grinding, etching, a combination thereof, etc.) may then be performed on the insulating encapsulation material. In some embodiments, during the planarization process, the back surface 131*b* of the semiconductor substrate 131 of the first die 130 is thinned down. After the planarization process, at least a portion of the conductive vias 132 of the first die 130 and at least a portion of the conductive pillars 120 may be accessibly exposed. Alternatively, the planarization process is omitted, and the amount of the insulating encapsulation material is controlled to not fully cover the first die 130 and the conductive pillars 120. The conductive pillars 120 penetrating through the first insulating encapsulation 140 may be referred to as first through insulation vias (TIVs) 120. In some embodiments, the top surface 140*t* of the first insulating encapsulation 140 is substantially leveled (or coplanar) with the top surfaces 120*t* of the TIVs 120, within process variations. The conductive vias 132 penetrating through the semiconductor substrate 131 may be referred to as through substrate vias (TSVs) 132. The back surface 130*b* of the first die 130 may be exposed by the first insulating encapsulation 140, where the back surface 130*b* includes the back surface 131*b* of the semiconductor substrate 131 (and the end surfaces 132*b* of the TSVs 132, if the TSVs 132 are exposed after the planarization process).

Figure 4:
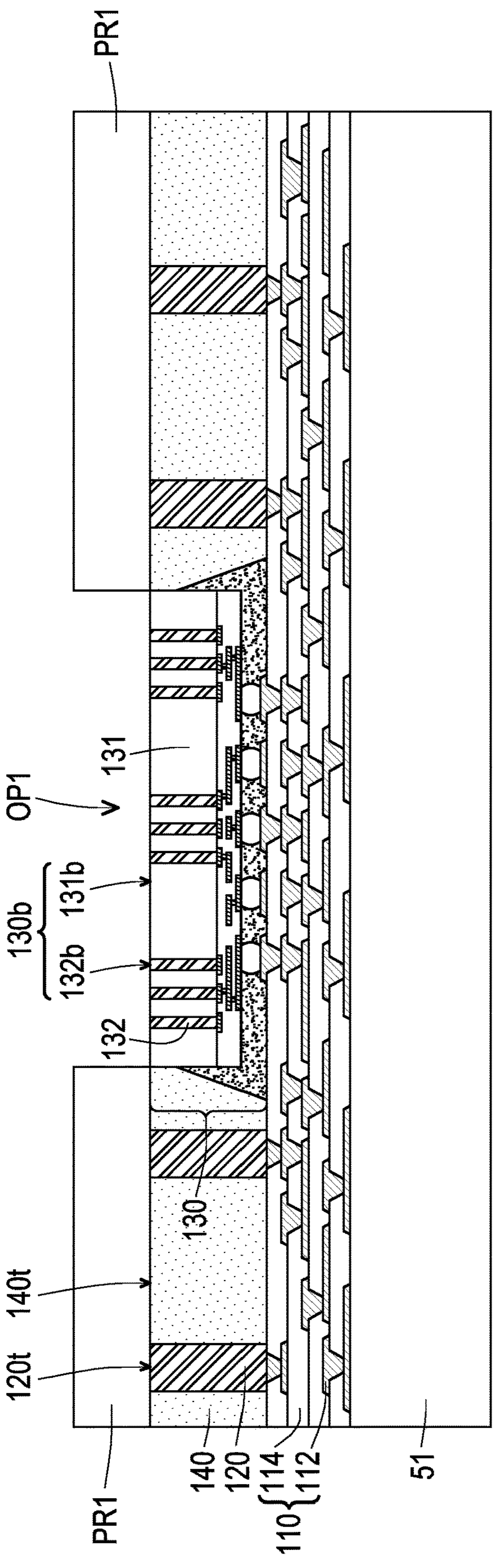

Referring to FIG. 4 and with reference to FIG. 3, a first mask layer PR1 may be formed on the top surface 140*t* of the first insulating encapsulation 140 and the top surfaces 120*t* of the TIVs 120. In some embodiments, the first mask layer PR1 includes an opening OP1 accessibly exposing the back surface 130*b* of the first die 130. The first mask layer PR1 may be formed by: depositing a mask material (e.g., a photoresist, any suitable light-sensitive material, or the like); and patterning the mask material using lithography techniques to form the opening OP1 in the mask material. The lithography techniques may involve irradiating (or exposing) and developing the mask material (not shown) to remove a pre-determined portion of the mask material so as to form the opening OP1. The remaining mask material forms the first mask layer PR1 which may protect the underlying structure, such as the first insulating encapsulation 140 and the TIVs 120 from the subsequent processing.

Figure 5:
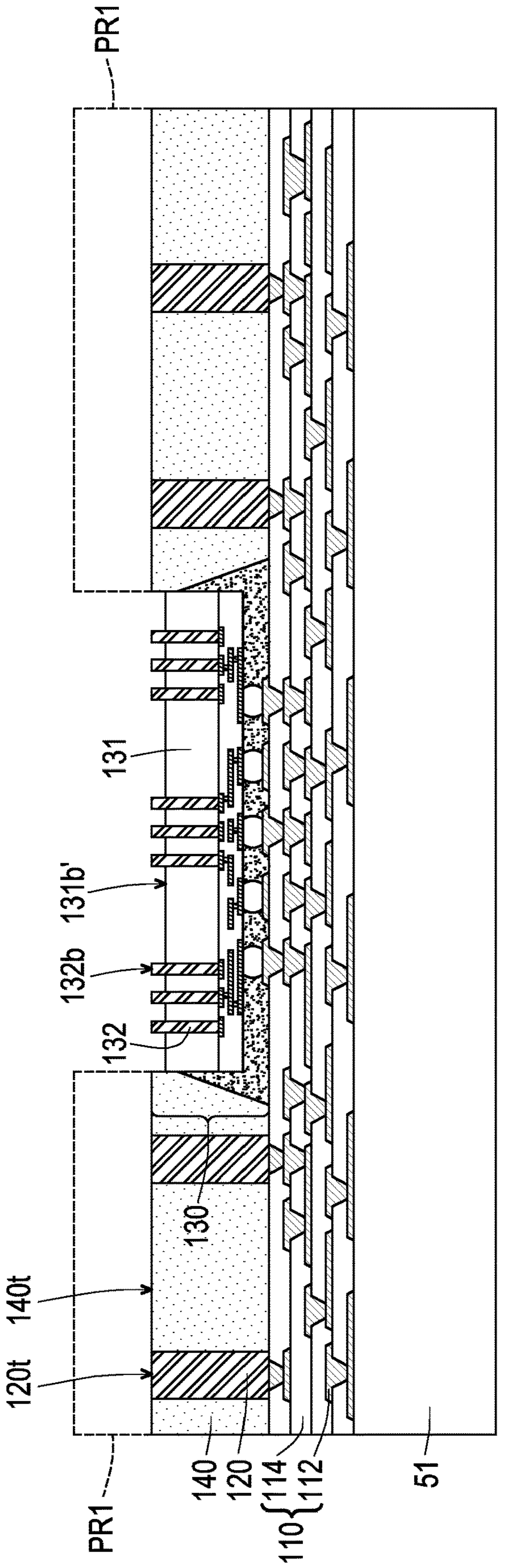

Referring to FIG. 5 and with reference to FIG. 4, the semiconductor substrate 131 may be recessed to form the recessed back surface 131*b*' of the first die 130. For example, one or more etching process is performed on the back surface 131*b* of the semiconductor substrate 131 using the first mask layer PR1 as an etching mask. The etching processes may be an anisotropic wet or dry etch. After recessing the semiconductor substrate 131, the TSVs 132 may be protruded from the recessed back surface 131*b*' of the semiconductor substrate 131. The first mask layer PR1 may then be removed through any suitable method(s). For example, where the first mask layer PR1 is formed of a photoresist material, the first mask layer PR1 may be removed using reactive ion etching (RIE), stripping solutions tailored for particular photoresists followed optionally by a plasma etch, and/or the like. Other method (e.g., dissolving the first mask layer PR1 in suitable solvent, etching the first mask layer PR1 using wet chemistry with an appropriate chemical solution, plasma etching, etc.) may be used depending on the material(s) of the first mask layer PR1. After removing the first mask layer PR1, the top surface 140*t* of the first insulating encapsulation 140 and the top surfaces 120*t* of the TIVs 120 may be revealed.

Figure 6:
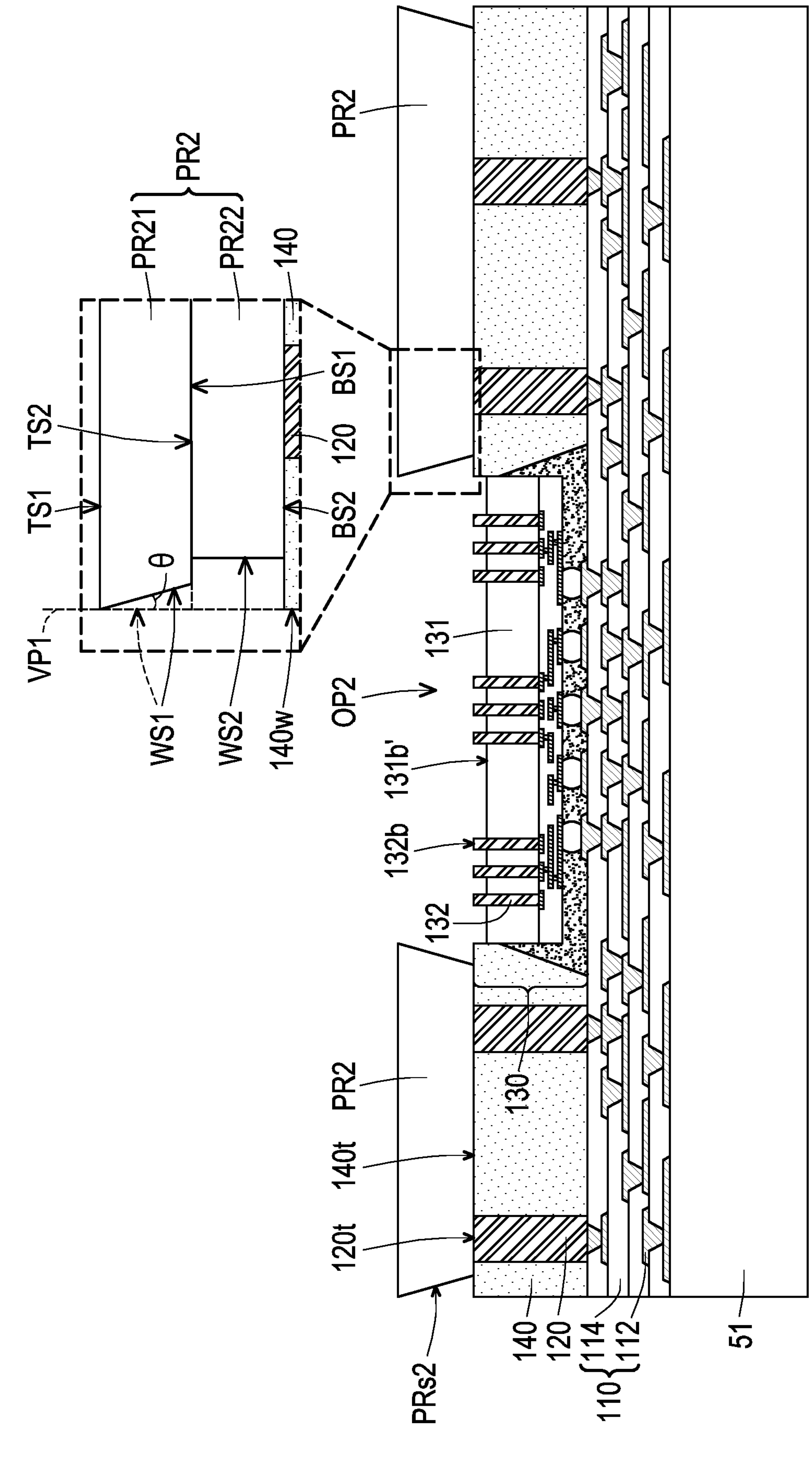

Referring to FIG. 6 and with reference to FIG. 5, a second mask layer PR2 may be formed on the top surface 140*t* of the first insulating encapsulation 140 and the top surfaces 120*t* of the TIVs 120. In some embodiments, the second mask layer PR2 includes an opening OP2 accessibly exposing the back side of the first die 130, where the back side includes the recessed back surface 131*b*' of the semiconductor substrate 131 and the top portions of the TSVs 132 protruded from the recessed back surface 131*b*'. The second mask layer PR2 may be formed by: depositing a mask material; and patterning the mask material using lithography techniques (e.g., exposure and development, or the like) to form the opening OP2 in the mask material. The remaining mask material forms the second mask layer PR2 which may protect the underlying structure including the first insulating encapsulation 140 and the TIVs 120 from the subsequent processing.

In some embodiments, the second mask layer PR2 includes a light-sensitive material (e.g., a negative photoresist, a positive photoresist, and/or the like). In some embodiments, the material of the second mask layer PR2 is able to withstand the operation temperature during the subsequently-performed deposition of a passivation material layer (see FIG. 7). For example, the material of the second mask layer PR2 is excellent in thermo-stability compared to that based on the first mask layer PR1 described in FIG. 4. By forming the second mask layer PR2 having desired thermo-stability, a risk of damage or deformation of the second mask layer PR2 during the formation of the passivation layer may be reduced or eliminated. The first insulating encapsulation 140 and the TIVs 120 covered by the second mask layer PR2 may thus be well-protected during the formation of the passivation layer.

With continued reference to FIG. 6, in some embodiments, the second mask layer PR2 includes a top portion PR21 and a bottom portion PR22 connected to the top portion PR21 and narrower than the top portion PR21, which may be advantageous in the removal (e.g., a lift-off process or the like) of the second mask layer PR2. The second mask layer PR2 may be a single layer (e.g., having an inverted trapezoid cross-sectional profile), a bilayer structure, or a multi-layered structure. In some embodiments, the top portion PR21 and the bottom portion PR22 are made of the different (or similar) light-sensitive material(s). A visible interface may be formed between the top portion PR21 and a bottom portion PR22. For example, the bottom portion PR22 is first formed on the first insulating encapsulation 140 and the TIVs 120 by: depositing a light-sensitive material; performing a lithography process (e.g., exposure and development, or the like) on the light-sensitive material to form the opening in the light-sensitive material; and curing (or baking) the remaining light-sensitive material on the first insulating encapsulation 140 and the TIVs 120. The top portion PR21 may then be formed on the bottom portion PR22 by the similar steps of forming the bottom portion PR22. Since the bottom portion PR22 has been cured before forming the top portion PR21, the material of the bottom portion PR22 may be harder (or more rigid) than the material of the top portion PR21. This may facilitate the formation of the second mask layer PR2 having a wider top and narrower bottom.

Still referring to the enlarged view in FIG. 6, the bottom portion PR22 may include a top surface TS2 connected to the top portion PR21, a bottom surface BS2 connected to the first insulating encapsulation 140 and the TIVs 120, and a sidewall WS2 connected to the top surface TS2 and the bottom surface BS2. In some embodiments, the sidewall WS2 of the bottom portion PR22 is substantially vertical, relative to the top surface 140*t* of the first insulating encapsulation 140. In some embodiments, a portion of the first insulating encapsulation 140 adjoining the first die 130 is unmasked (or exposed) by the bottom portion PR22. The top portion PR21 may include a top surface TS1, a bottom surface BS1 connected to the bottom portion PR22, and a sidewall WS1 connected to the top surface TS1 and the bottom surface BS1. In some embodiments, the sidewall WS1 of the top portion PR21 is laterally offset from the sidewall WS2 of the bottom portion PR22. In some embodiments, at least the intersection of the sidewall WS1 and the top surface TS1 of the top portion PR21 is substantially aligned with the inner sidewall 140*w* of the first insulating encapsulation 140 which faces the first die 130. In some other embodiments where the second mask layer PR2 does not fully cover the first insulating encapsulation (e.g., see FIG. 12), the intersection of the sidewall WS1 and the top surface TS1 of the top portion PR21 is between the inner sidewall 140*w* of the first insulating encapsulation 140 and the sidewall WS2 of the bottom portion PR22.

In some embodiments, the sidewall WS1 of the top portion PR21 is tilted. For example, the top portion PR21 is tapered toward the bottom portion PR22. The top portion PR21 may have an inverted trapezoid cross-sectional profile. For example, an included angle θ is between the sidewall WS1 and a virtual plane VP1 on which the inner sidewall 140*w* of the first insulating encapsulation 140 is disposed. The included angle θ may be an acute angle. In alternative embodiments, the sidewall WS1 of the top portion PR21

(illustrated in the dashed lines) is substantially vertical relative to the top surface 140*t* of the first insulating encapsulation 140. The sidewall WS1 may substantially overlap the virtual plane VP1 on which the inner sidewall 140*w* of the first insulating encapsulation 140 is disposed. In some embodiments, the area of the bottom surface BS1 of the top portion PR21 is greater than the area of the top surface TS2 of the bottom portion PR22. For example, the contact area of the bottom portion PR22 connected to the top portion PR21 is less than the area of the bottom surface BS1 of the top portion PR21. The top surface TS1 of the top portion PR21 may partially (or fully) shield the portion of the top surface 140*t* of the first insulating encapsulation 140 that is unmasked by the bottom portion PR22. It should be noted that the second mask layer PR2 may have a different profile or configuration than shown as long as the profile/configuration of the second mask layer PR2 facilitates the subsequently-performed removal process.

Figure 7:
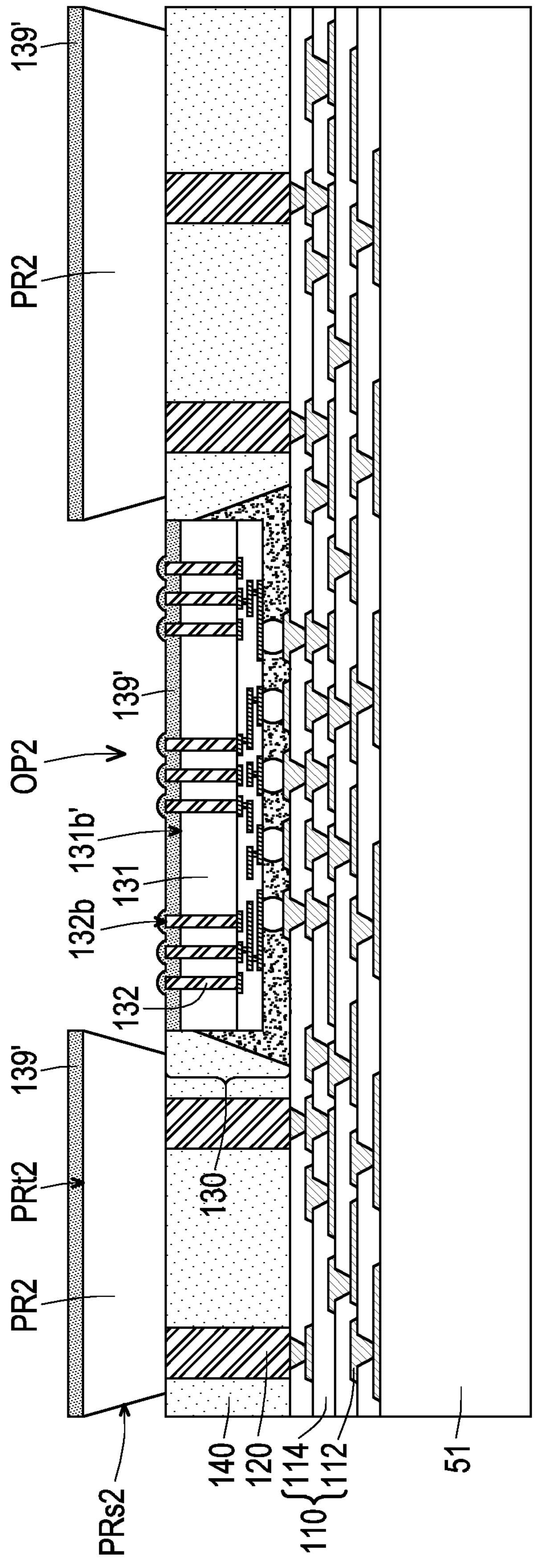

Referring to FIG. 7 and with reference to FIG. 6, a passivation material layer 139' may be formed on the second mask layer PR2 and in the opening OP2 of the second mask layer PR2 by any suitable deposition process (e.g., chemical vapor deposition (CVD), plasma-enhanced CVD (PECVD), high-density plasma chemical vapor deposition (HDP-CVD), or the like). Other deposition method(s) may be used. For example, the deposition of the passivation material layer 139' is performed at a temperature in the range between about the room temperature and about 180° C. As mentioned in the preceding paragraphs, the material of the second mask layer PR2 is excellent in thermo-stability, so that during the deposition of the passivation material layer 139', the operation temperature does not affect the second mask layer PR2. In this manner, the first insulating encapsulation 140 and the TIVs 120 covered by the second mask layer PR2 may be well-protected during the deposition of the passivation material layer 139'. In some embodiments, the passivation material layer 139' is deposited on the top surface PRt2 of the second mask layer PR2, the recessed back surface 131*b*' of the semiconductor substrate 131, and the end surfaces 132*b* of the TSVs 132. In some embodiments, the sidewalls PRs2 (e.g., the sidewalls WS1 and WS2 labeled in FIG. 6) of the second mask layer PR2 are exposed by the passivation material layer 139' for facilitating the subsequently-performed removing process.

Figure 8:
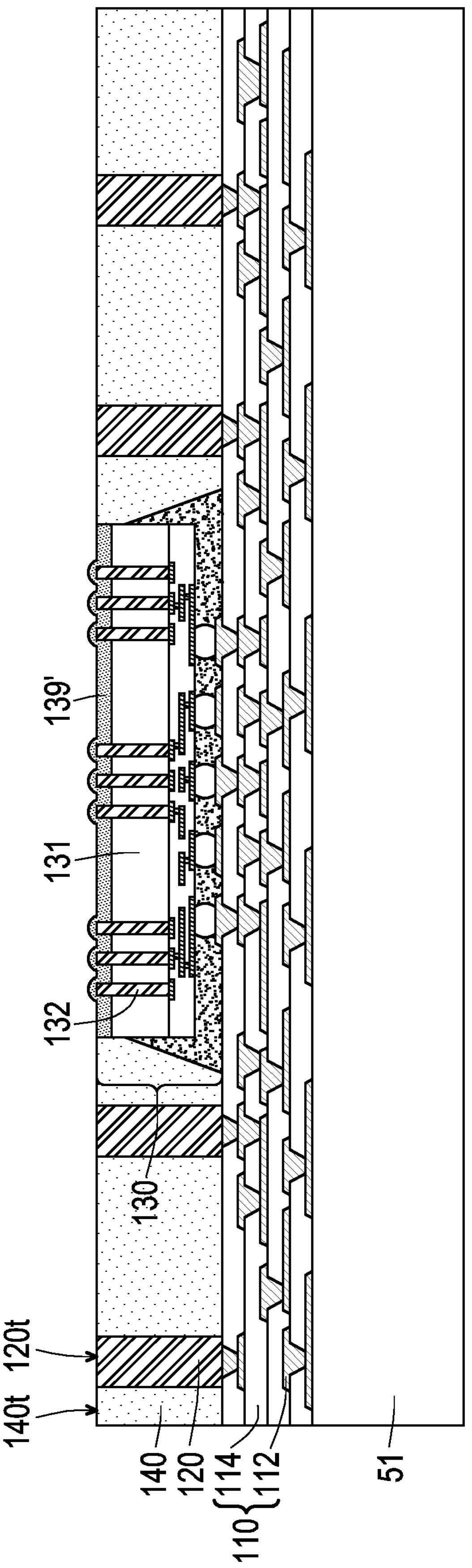

Referring to FIG. 8 and with reference to FIG. 7, a removing process may be performed on the second mask layer PR2 by using any suitable process (e.g., a lift-off process, a stripping process, an ashing process, a peeling process, and/or the like). In some embodiments where the lift-off process is performed, a lift-off agent is used to remove the second mask layer PR2, where the lift-off agent may include any suitable solvent depending on the material (s) of the second mask layer PR2. During the removal of the second mask layer PR2, a portion of the passivation material layer 139' formed on the top surface PRt2 of the second mask layer PR2 may be removed along with the second mask layer PR2. After the removal of the second mask layer PR2, the top surface 140*t* of the first insulating encapsulation 140 and the top surfaces 120*t* of the TIVs 120 may be exposed. The rest portion of the passivation material layer 139' may remain on the back side of the first die 130. The removing process may include a cleaning step for removing mask residues left of the first insulating encapsulation 140 and the TIVs 120.

Figure 9:
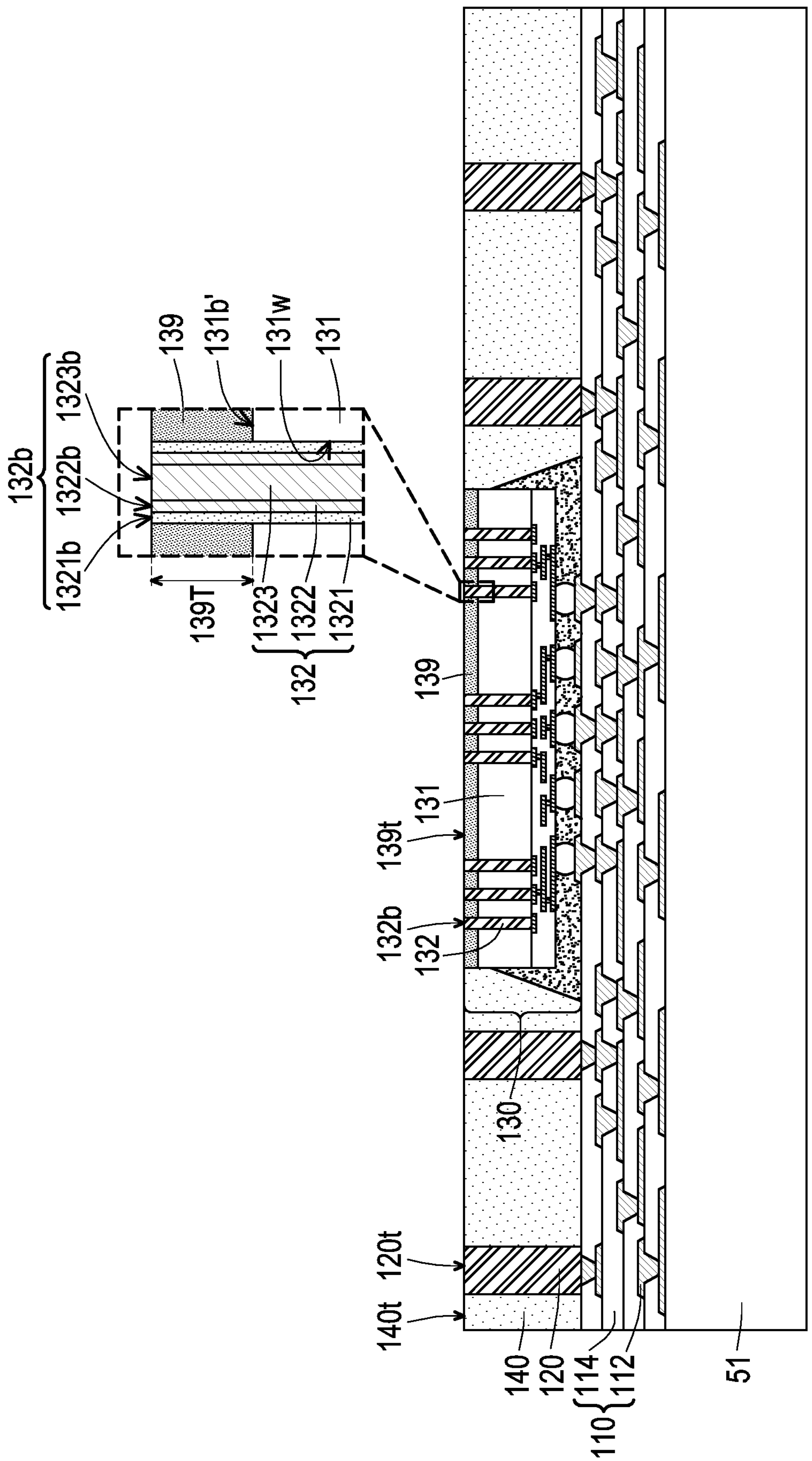

Referring to FIG. 9 and with reference to FIG. 8, a planarization process (e.g., CMP, mechanical grinding, etching, a combination thereof, etc.) may be performed to remove excess portions of the passivation material layer 139' so as to form a passivation layer 139. For example, the excess portions of the passivation material layer 139' include the portions of the passivation material layer 139' overlying the end surfaces 132*b* of the TSVs 132. The planarization process may be chosen to be highly selective to the passivation material layer 139' relative to the material of the first insulating encapsulation 140 and the materials of the TSVs 132 and the TIVs 120, so that those features may be removed only slightly relative to the removal of the passivation material layer 139'. After the planarization process, the TSVs 132 may be exposed by the passivation layer 139. For example, the top surface 139*t* of the passivation layer 139 and the end surfaces 132*b* of the TSVs 132 are substantially leveled (or coplanar) with the top surface 140*t* of the first insulating encapsulation 140 and the top surfaces 120*t* of the TIVs 120, within process variations. The thickness 139T of the passivation layer 139 may be in a range of about 0.75 μm and about 1.05 μm, such as about 0.9 μm. In some embodiments, the thickness 139T of the passivation layer 139 is less than 1.4 μm, where if the thickness 139T is beyond this value, the first die 130 may crack during the subsequently processes. It should be noted that other value of the thickness may be possible depending on process and product requirements.

As illustrated in the enlarged view of FIG. 9, the respective TSV 132 includes a dielectric liner 1321 lining the inner sidewall 131*w* of the semiconductor substrate 131, a seed layer 1322 lining the dielectric liner 1321, and a metallic layer 1323 overlying the seed layer 1322. The dielectric liner 1321 may be a single layer or a composite layer including multiple sublayers with different materials. For example, the dielectric liner 1321 includes a material having good moisture-resistant ability and/or lower leakage of current. The dielectric liner 1321 may be or include an oxide, an oxycarbide, a combination thereof, and/or the like. The passivation layer 139 may be in lateral and physical contact with the dielectric liner 1321. In some embodiments where the dielectric liner 1321 and the passivation layer 139 are made of different materials, a visible interface is formed between the dielectric liner 1321 and the passivation layer 139. The seed layer 1322 may be a single layer (e.g., Cu film) or may include multiple sublayers (e.g., Ti/Cu films). The metallic layer 1323 may include a metallic material such as Cu, Cu alloy, or the like, and may be formed by plating or any suitable deposition method. In some embodiments, the end surface 132*b* of the respective TSV 132 includes an end surface 1321*b* of the dielectric liner 1321, an end surface 1322*b* of the seed layer 1322 encircled by the end surface 1321*b*, and an end surface 1323*b* of the metallic layer 1323 encircled by the end surface 1322*b*.

Figure 10:
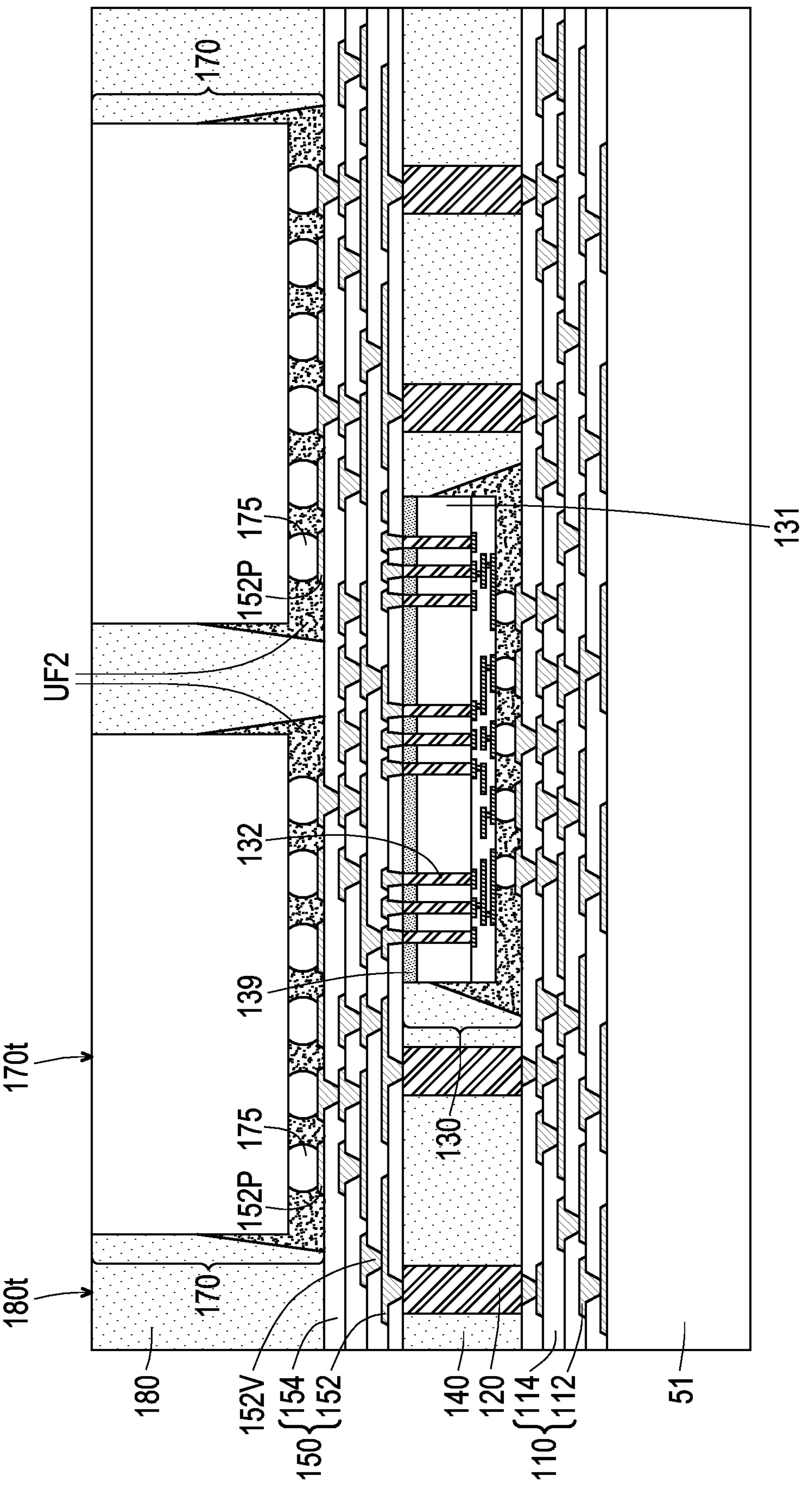

Referring to FIG. 10 and with reference to FIG. 9, a second redistribution structure 150 may be formed on the TIVs 120, the TSVs 132 of the first die 130, the passivation layer 139, and the first insulating encapsulation 140. The second redistribution structure 150 may include one or more second patterned conductive layer(s) 152 formed in one or more second dielectric layer(s) 154. The second dielectric layer(s) 154 may include a polymer, such as PBO, polyimide, BCB, and/or the like, and may be formed by a suitable deposition process, such as spin-coating, CVD, a combination thereof, etc. The second patterned conductive layer 152 may include conductive features (e.g., conductive lines, conductive vias, and conductive pads), and may be formed of suitable conductive material(s) such as copper, titanium, tungsten, aluminum, alloy, or the like. The respective conductive via 152V of second patterned conductive layer 152 may be tapered in a direction same as the conductive via 112V (labeled in FIG. 1) of the first redistribution structure 110.

In some embodiments, the bottommost sublayer of the second dielectric layer 154 overlies the top surfaces (139*t* and 140*t*) of the passivation layer 139 and the first insulating encapsulation 140, and may partially (or fully) reveal the end surfaces 132*b* of the TSVs 132 and the top surfaces 120*t* of the TIVs 120. In some embodiments, the bottommost sublayer (e.g., conductive vias 152V) of the second patterned conductive layer 152 passing through the bottommost sublayer of the second dielectric layer 154 to be in physical and electrical contact with the end surfaces 132*b* of the TSVs 132 and the top surfaces 120*t* of the TIVs 120. The second redistribution structure 150 may be electrically coupled to the first redistribution structure 110 through the first TIVs 120 (and the first die 130, depending on the circuit design). In some embodiments, the topmost sublayer of the second patterned conductive layer 152 includes contact pads 152P formed on the topmost sublayer of the second dielectric layer 154 for further electrical connection. It is noted that the number of sublayers of the second dielectric layer 154 and the second patterned conductive layer 152 construes no limitation in the disclosure.

With continued reference to FIG. 10, one or more second die(s) 170 may be disposed over the second redistribution structure 150 and electrically coupled to the second patterned conductive layer 152. The respective second die 170 may be any type of integrated circuit die such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In some embodiments, the respective second die 170 includes second die connectors 175 landing on the contact pads 152P of the second redistribution structure 150. The second die connectors 175 including a solder material may be coupled to the contact pads 152P through, for example, a reflow process. The second dies 170 may be electrically coupled to the first die 130 through the second redistribution structure 150. In some embodiments, the first die 130 functioning as a bridge die is in electrical communication with at least two of adjacent second dies 170. In some embodiments, the first die 130 is disposed directly below the at least two of adjacent second dies 170. For example, each of the orthogonal projection of the at least two of adjacent second dies 170 partially overlaps the orthogonal projection of the first die 130.

Still referring to FIG. 10, a second underfill layer UF2 may be formed in the gap between the respective second die 170 and the second redistribution structure 150 to surround the second die connectors 175 and the contact pads 152P. In some embodiments, the second underfill layer UF2 extends upward to cover sidewalls of the respective second die 170. The second underfill layer UF2 may be the same as or similar to the first underfill layer UF1 described in FIG. 2. Alternatively, the second underfill layer UF2 is omitted. A second insulating encapsulation 180 may be formed on the second redistribution structure 150 to cover the second dies 170 and the second underfill layer UF2 (if exists). The material and the forming method of the second insulating encapsulation 180 may be similar to those of the first insulating encapsulation 140 described in FIG. 3, and thus the details of the second insulating encapsulation 180 are not repeated herein. A planarization process (e.g., CMP, mechanical grinding, etching, a combination thereof, etc.) is optionally performed on the second insulating encapsulation 180 to level the top surface 180*t* of the second insulating encapsulation 180 and the back sides 170*t* of the second dies 170. Alternatively, the second insulating encapsulation 180 covers the back side(s) 170*t* of one or more second die(s) 170.

Figure 11:
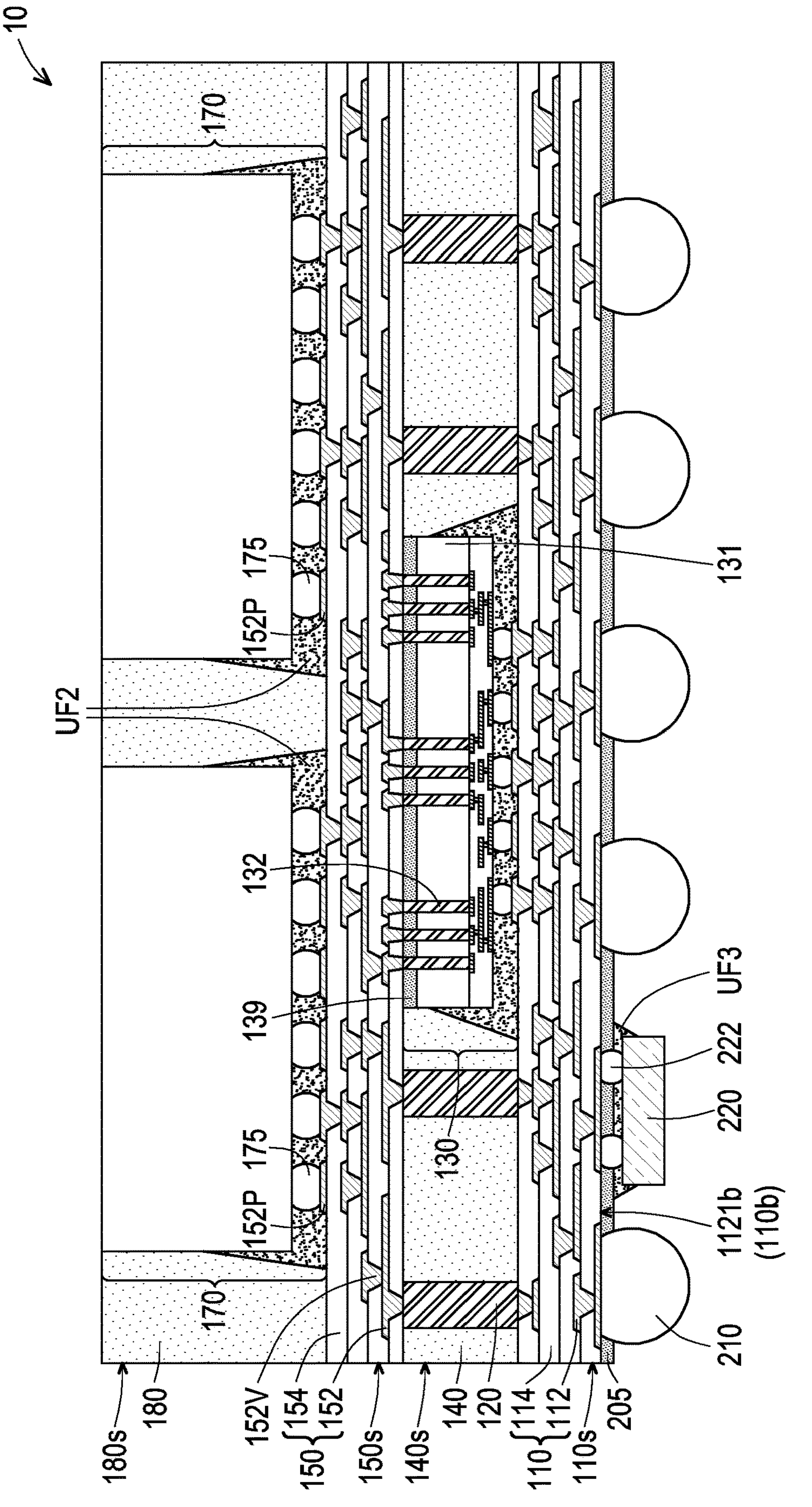

Referring to FIG. 11 and with reference to FIG. 10, the temporary carrier 51 may be removed from the first redistribution structure 110 through any suitable process, such as etching, grinding, mechanical peeling, or the like, to accessibly reveal the second surface 110*b* of the first redistribution structure 110. In an embodiment where an adhesive layer (e.g., a LTHC film) is formed between the temporary carrier 51 and the first redistribution structure 110, the temporary carrier 51 is de-bonded by exposing to a light source. The light source breaks the chemical bonds of the adhesive layer that binds to the temporary carrier 51, and the temporary carrier 51 may then be de-bonded. Other debonding method may be applied. After exposing the second surface 110*b* of the first redistribution structure 110, a plurality of conductive terminals 210 may be formed on the second surface 110*b* of the first redistribution structure 110. The conductive terminals 210 may include a conductive material such as solder, copper, aluminum, gold, nickel, silver, palladium, tin, the like, or a combination thereof. The conductive terminals 210 may be solder balls, metal pillars, a ball grid array (BGA), controlled collapse chip connection (C4) bumps, micro bumps, electroless nickel-electroless palladium-immersion gold (ENEPIG) technique formed bumps, combination thereof, etc.

In some embodiments, before forming the conductive terminals 210, a protective layer 205 is formed on the second surface 110*b* of the first redistribution structure 110, and the protective layer 205 includes openings partially (or fully) revealing the surfaces 1121*b* of the bottommost sublayers 1121 of the first patterned conductive layer 112. The conductive terminals 210 may then be formed on surfaces 1121*b* and in the openings of the protective layer 205 to be in physical and electrical contact with the bottommost sublayers 1121 of the first patterned conductive layer 112. In some embodiments, before forming the conductive terminals 210, under bump metallization (UBM) pads (not shown) are formed on the surfaces 1121*b* and in the openings of the protective layer 205 to be in physical and electrical contact with the bottommost sublayers 1121 of the first patterned conductive layer 112. The conductive terminals 210 may then be formed on the UBM pads.

With continued reference to FIG. 11, an electrical device 220, such as an integrated passive device (IPD), may be disposed on and electrically coupled to the second surface 110*b* of the first redistribution structure 110. The electrical device 220 may include device connectors 222 coupled to the bottommost sublayers 1121 of the first patterned conductive layer 112. In some embodiments, the electrical device 220 is electrically coupled to the first die 130 through the first patterned conductive layer 112 of the first redistribution structure 110. In some embodiments, the electrical device 220 is electrically coupled to the second die(s) 170 through the first redistribution structure 110, the TIVs 120, and the second redistribution structure 150. In some embodiments, a third underfill layer UF3 may be formed in the gap between the electrical device 220 and the second surface 110*b* of the first redistribution structure 110 (or the protective layer 205, if present) to surround the device connectors 222 for protection. Alternatively, the electrical device 220 is omitted.

The structure shown in FIG. 11 may be viewed as a semiconductor package 10. In some embodiments, the aforementioned processes are performed in wafer level, and a singulation process may be formed to form individual semiconductor packages 10. For example, the respective semiconductor package 10 includes a conterminous sidewall including the singulated sidewall 180*s* of the second insulating encapsulation 180, the singulated sidewall 150*s* of the second redistribution structure 150, the singulated sidewall 140*s* of the first insulating encapsulation 140, and the singulated sidewall 110*s* of the first redistribution structure 110 that are substantially aligned (or coplanar) with one another. It should be noted that the semiconductor package 10 is provided for illustrative purposes only, and other embodiments may utilize fewer or additional elements.

The semiconductor package 10 includes the first die 130 and the second dies 170 stacked over the first die 130 and electrically coupled to the first die 130 through the second redistribution structure 150. The passivation layer 139 is interposed between the first die 130 and the second redistribution structure 150 in the stacking direction of the first die 130 and the second redistribution structure 150. The passivation layer 139 is formed on the back side of the semiconductor substrate 131 and laterally surrounds the respective TSV 132 of the first die 130. The passivation layer 139 may be made of a material which provides the benefit of low structural stress due to its high hardness. For example, as compared to the passivation layer made of polyimide, the passivation layer 139 made of a high tensile strength material may be highly tensile stressed on the semiconductor substrate 131. Since the passivation layer has the material property of high tensile strength, it can be made of a very thin layer as compared to the passivation layer made of polyimide. In some embodiments, the tensile strength of the material of the passivation layer 139 is higher than the tensile strength of the material of the first dielectric layer 114 and/or second dielectric layer 154. By using the high tensile strength material to form the passivation layer 139, a risk of cracking the passivation layer 139 may be reduced or eliminated.

During the formation of the passivation layer 139, the first insulating encapsulation 140 and the TIVs 120 are covered by the mask layer (see FIG. 6), so that the passivation material layer is not directly deposited on the first insulating encapsulation 140 and the TIVs 120. In this manner, when removing the excess portion of the passivation material layer, there is no need to remove the passivation material layer from the first insulating encapsulation 140 and the TIVs 120. The issues (e.g., the passivation residues left on the TIVs 120, insufficient thickness of the passivation layer on the semiconductor substrate, and/or the like) may be eliminated. For example, a lift-off process is performed during the removal of the mask layer formed on the first insulating encapsulation 140 and the TIVs 120. The portion of the passivation material layer deposited on the mask layer over the first insulating encapsulation 140 and the TIVs 120 may be removed along with the mask layer during the lift-off process. This may facilitate reliable manufacturing of the passivation layer 139 and the process window of fabricating the semiconductor package 10 may be enlarged.

Figure 12:
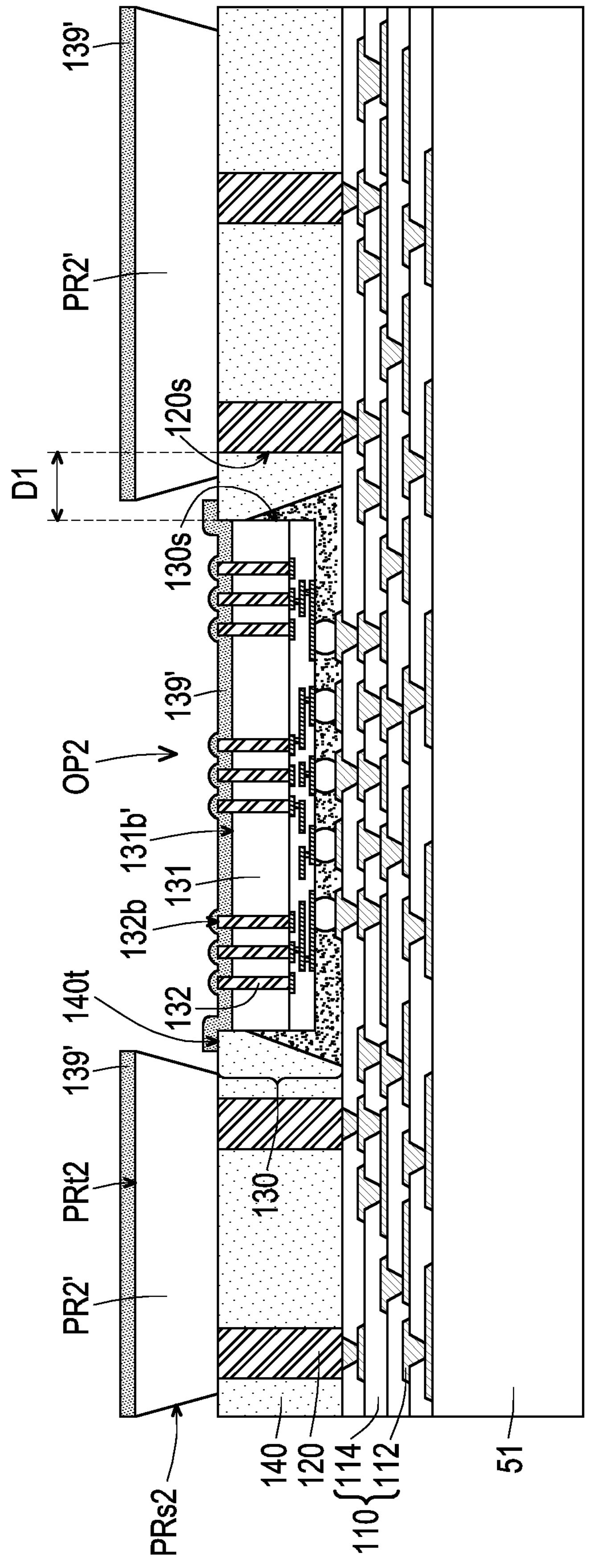
FIGS. 12-14 are schematic cross-sectional views of various stages of manufacturing a semiconductor package, in accordance with some embodiments.
Figure 13:
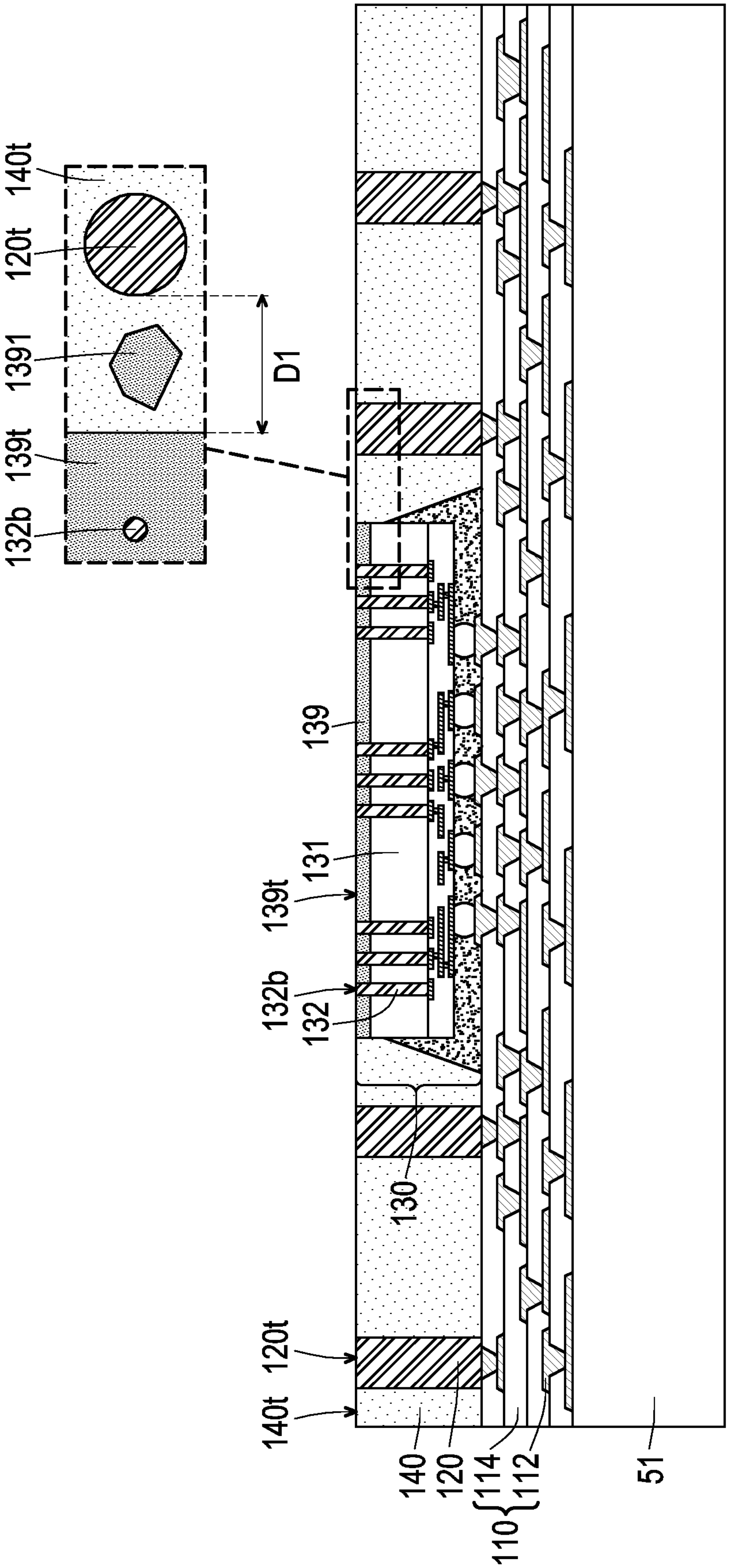
Figure 14:
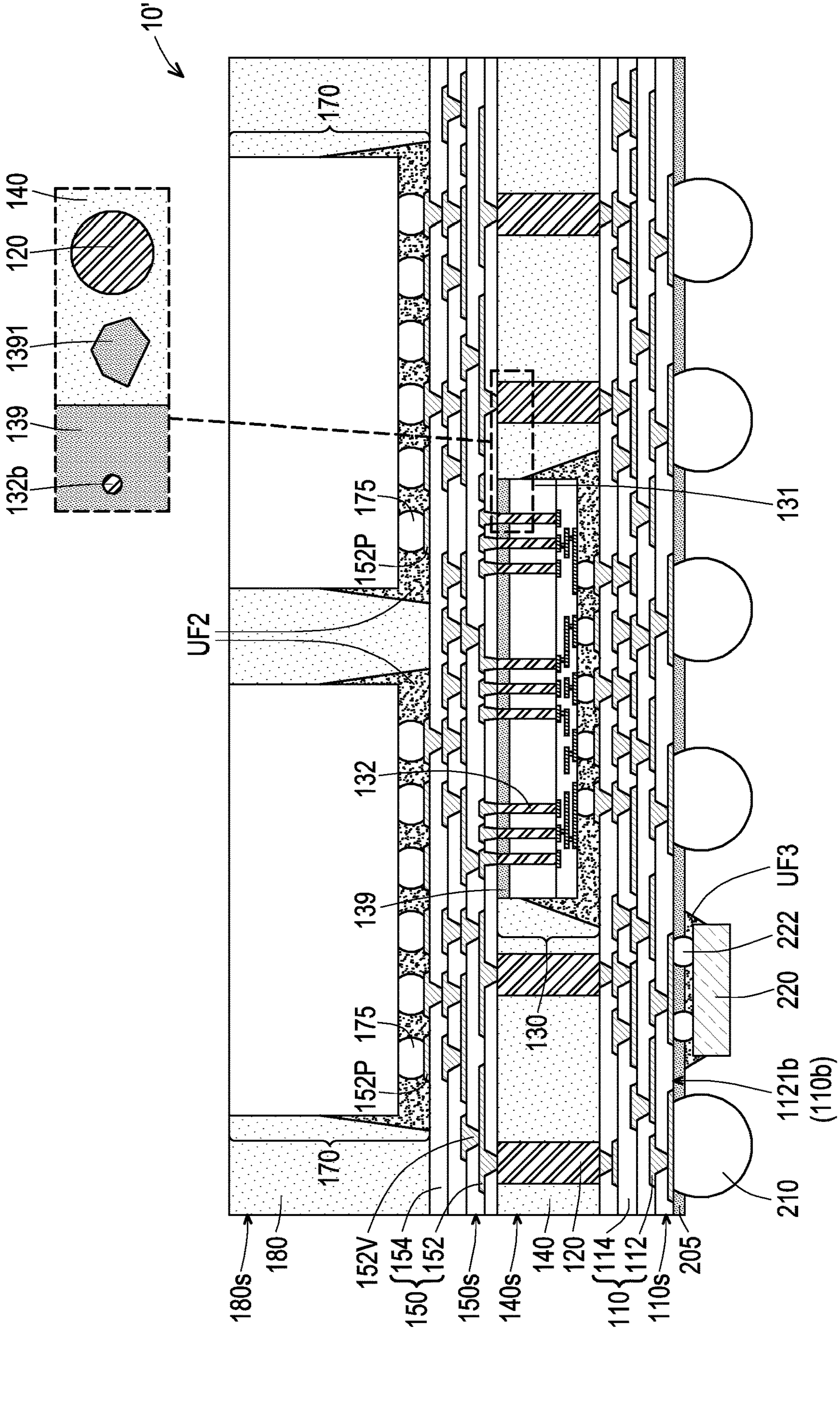

FIGS. 12-14 are schematic cross-sectional views of various stages of manufacturing a semiconductor package, in accordance with some embodiments. Unless specified otherwise, the materials and the formation methods of the components in the semiconductor package are essentially the same as the like components in the semiconductor package 10, which are denoted by like reference numerals in the embodiments shown in FIGS. 1-11. The details regarding the formation process and the materials of the components shown in FIGS. 12-14 may thus be found in the discussion of the embodiments shown in FIGS. 1-11.

Regarding FIG. 12 and with reference to FIG. 7, the structure shown in FIG. 12 is similar to the structure shown in FIG. 7, except that the second mask layer PR2' does not fully cover the underlying first insulating encapsulant 140, and the passivation material layer 139' may be deposited on the exposed portion of the top surface 140*t* of the first insulating encapsulant 140 which is unmasked by the second mask layer PR2'. In some embodiments, the exposed portion of the top surface 140*t* of the first insulating encapsulant 140 adjoins the first die 130. The passivation material layer 139' may extend from the interface between the first die 130 and the first insulating encapsulation 140 toward the top surface 120*t* of the TIV 120 disposed closest to the first die 130. In some embodiments, the shortest lateral distance D1 is measured between the sidewall 130*s* of the first die 130 and the sidewall 120*s* of a TIV 120 disposed closest to the first die 130. For example, the shortest lateral distance D1 is at least 150 μm. Other value of the shortest lateral distance D1 may be possible depending on product design. The exposed portion of the top surface 140*t* of the first insulating encapsulant 140 on which the passivation material layer 139 may extend across may have the maximum lateral dimension less than the shortest lateral distance D1. In this manner, the passivation material layer 139' does not extend to cover the TIV 120 disposed closest to the first die 130.

Regarding FIG. 13 and with reference to FIG. 12 and FIG. 8, the structure shown in FIG. 13 is similar to the structure shown in FIG. 8, except that after planarizing the passivation material layer 139', passivation residues 1391 may be left on the top surface 140*t* of the first insulating encapsulant 140. The upper dashed box in FIG. 13 shows the schematic top view of the corresponding lower dashed box. For example, the passivation residues 1391 is physically separated from the passivation layer 139 overlying the semiconductor substrate 131. In alternative embodiments, the passivation residues 1391 extends to the interface of the first insulating encapsulant 140 and the passivation layer to be physically connected to the passivation layer 139 overlying the semiconductor substrate 131. As illustrated in the enlarged top view in FIG. 13, the passivation residues 1391 left on the top surface 140*t* of the first insulating encapsulant 140 may be spaced apart from the TIVs 120*t*, so that the electrical performance of the TIVs 120*t* will not be affected.

Regarding FIG. 14 and with reference to FIG. 13 and FIG. 11, the semiconductor package 10' shown in FIG. 14 is similar to the semiconductor package 10 shown in FIG. 11, except that the semiconductor package 10' includes the passivation residues 1391 overlying the first insulating encapsulant 140 and covered by the second dielectric layer 154 of the second redistribution structure 150. The processes performed on the structure of FIG. 13 may be similar to the processes described in FIGS. 9-11 so as to form the semiconductor package 10', and thus the details thereof are not repeated herein.

Embodiments may have one or a combination of the following features and/or advantages. The semiconductor package includes the passivation layer vertically interposed between the first die and the second redistribution structure and formed on the back side of the semiconductor substrate of the first die to laterally surround the TSVs of the first die. The passivation layer may be made of a relatively high tensile strength material which may be highly tensile stressed on the semiconductor substrate. Since the passivation layer has the material property of high tensile strength, it can be made of a very thin layer, and meanwhile, retains its advantageous characteristics. The passivation layer in the semiconductor package may serve as a stress-relief layer. For example, the passivation layer made of silicon nitride may lower the stress in the semiconductor package by about 65%, as compared to the passivation layer made of polyimide. By using the high tensile strength material to form the passivation layer, a risk of cracking the passivation layer may be reduced or eliminated.

During the deposition of the passivation layer, the first insulating encapsulation and the TIVs are covered by the mask layer, so that the passivation material layer is not directly deposited on the first insulating encapsulation and the TIVs. In this manner, when removing the excess portion of the passivation material layer, there is no need to remove the passivation material layer from the surfaces of the first insulating encapsulation and the TIVs. During the lift-off process to remove the mask layer from the first insulating encapsulation and the TIVs, the portion of the passivation material layer on the mask layer may be removed along with the mask layer. This may facilitate reliable manufacturing of the passivation layer and the process window of fabricating the semiconductor package may be enlarged. The aforementioned methods for forming the semiconductor package may reduce cost, decrease process cycle times, and reduce crack concern.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments, a manufacturing method of a semiconductor package includes: laterally covering a first die and a TIV with an insulating encapsulation, where the first die includes a semiconductor substrate and a TSV penetrating through the semiconductor substrate; recessing the semiconductor substrate so that the TSV protrudes above a recessed surface of the semiconductor substrate; forming a patterned mask layer on the insulating encapsulation and the TIV, where the patterned mask layer exposes the recessed surface of the semiconductor substrate and the TSV; forming a passivation material layer on the first die and the patterned mask layer, where a sidewall of the patterned mask layer is exposed by the passivation material layer; removing the patterned mask layer along with a portion of the passivation material layer formed on the patterned mask layer to expose the insulating encapsulation and the TIV; and removing an excess portion of the passivation material layer formed on the TSV to form a passivation layer laterally covering the TSV.

In accordance with some embodiments, a manufacturing method of a semiconductor package includes: forming an insulating encapsulation to cover a first die and a TIV disposed alongside the first die, where the first die includes a semiconductor substrate and a TSV embedded in the semiconductor substrate; partially removing the semiconductor substrate to reveal the TSV; forming a patterned mask layer on the insulating encapsulation and the TIV, where the semiconductor substrate and the TSV are exposed by the patterned mask layer, and the patterned mask layer includes a top portion and a bottom portion below the top portion and narrower than the top portion; forming a passivation material layer on the first die and the patterned mask layer, where a sidewall of the patterned mask layer is free of the passivation material layer; removing the patterned mask layer; and planarizing the passivation material layer and the TSV.

In accordance with some embodiments, a manufacturing method of a semiconductor package includes: forming an insulating encapsulation on a redistribution structure to cover a first die and a TIV that are disposed on the redistribution structure, where the first die includes a semiconductor substrate and a TSV embedded in the semiconductor substrate; recessing a back surface of the semiconductor substrate so that the TSV protrudes above a recessed back surface of the semiconductor substrate; and forming a passivation layer on the recessed back surface of the semiconductor substrate to laterally cover the TSV, where a material of the passivation layer has a higher tensile strength than a dielectric layer of the redistribution structure, and top surfaces of the passivation layer, the TSV, the insulating encapsulation, and the TIV are substantially leveled with one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:

laterally covering a first die and a through insulation via (TIV) with an insulating encapsulation, wherein the first die comprises a semiconductor substrate and a through substrate via (TSV) penetrating through the semiconductor substrate;

recessing the semiconductor substrate so that the TSV protrudes above a recessed surface of the semiconductor substrate;

forming a patterned mask layer on the insulating encapsulation and the TIV, wherein the patterned mask layer exposes the recessed surface of the semiconductor substrate and the TSV;

forming a passivation material layer on the first die and the patterned mask layer, wherein a sidewall of the patterned mask layer is exposed by the passivation material layer;

removing the patterned mask layer along with a portion of the passivation material layer formed on the patterned mask layer to expose the insulating encapsulation and the TIV; and removing an excess portion of the passivation material layer formed on the TSV to form a passivation layer laterally covering the TSV.

2. The manufacturing method of claim 1, wherein forming the patterned mask layer on the insulating encapsulation and the TIV comprises:

forming a bottom portion of the patterned mask layer on the insulating encapsulation and the TIV; and forming a top portion of the patterned mask layer on the bottom portion, wherein the top portion is wider than the bottom portion.

3. The manufacturing method of claim 2, wherein forming the patterned mask layer on the insulating encapsulation and the TIV further comprises:

curing the bottom portion before forming the top portion, wherein after forming the top portion, the bottom portion is harder than the top portion.

4. The manufacturing method of claim 2, wherein forming the patterned mask layer on the insulating encapsulation and the TIV further comprises:

forming a light-sensitive material on the insulating encapsulation and the TIV;

performing an exposure and development process on the light-sensitive material to form the bottom portion of the patterned mask;

performing a curing process on the bottom portion;

forming another light-sensitive material on the bottom portion;

performing another exposure and development process on the another light-sensitive material to form the top portion of the patterned mask layer; and performing another curing process on the top and bottom portions of the patterned mask layer.

5. The manufacturing method of claim 1, wherein removing the excess portion of the passivation material layer formed on the TSV comprises:

performing a planarization process on the passivation material layer, wherein after the planarization process, top surfaces of the passivation layer and the TSV are substantially coplanar.

6. The manufacturing method of claim 1, further comprising:

forming a redistribution structure on the insulating encapsulation, the TIV, the passivation layer, and the TSV of the first die, wherein the redistribution structure comprises a dielectric layer and a patterned conductive layer covered by the dielectric layer and electrically connected to the TSV and the TIV, and a tensile strength of a material of the passivation layer is higher than that of a material of the dielectric layer.

7. The manufacturing method of claim 6, further comprising:

disposing a second die on the redistribution structure, wherein the first die is electrically connected to the second die through the patterned conductive layer of the redistribution structure.

8. The manufacturing method of claim 1, wherein recessing the semiconductor substrate comprising:

forming an etch mask layer on the insulating encapsulation and the TIV, wherein the semiconductor substrate of the first die is exposed by the etch mask layer;

etching the semiconductor substrate of the first die after forming the etch mask layer; and removing the etch mask layer before forming the patterned mask layer.

9. The manufacturing method of claim 8, wherein a material of the patterned mask layer has a better thermostability than that of the etch mask layer.

10. The manufacturing method of claim 1, wherein:

forming the passivation material layer on the first die, wherein the passivation material layer extends to cover a portion of the insulating encapsulation that is unmasked by the patterned mask layer, and removing the excess portion of the passivation material layer, wherein after removing the excess portion of the passivation material layer, a passivation residue is left on the portion of the insulating encapsulation.

11. The manufacturing method of claim 10, further comprising:

forming a redistribution structure on the insulating encapsulation, the TIV, the passivation layer, and the first die, wherein the passivation residue is covered by a dielectric layer of the redistribution structure.

12. A manufacturing method of a semiconductor package, comprising:

forming an insulating encapsulation to cover a first die and a through insulation via (TIV) disposed alongside the first die, wherein the first die comprises a semiconductor substrate and a through substrate via (TSV) embedded in the semiconductor substrate;

partially removing the semiconductor substrate to reveal the TSV;

forming a patterned mask layer on the insulating encapsulation and the TIV, wherein the semiconductor substrate and the TSV are exposed by the patterned mask layer, and the patterned mask layer comprises a top portion and a bottom portion below the top portion and narrower than the top portion;

forming a passivation material layer on the first die and the patterned mask layer, wherein a sidewall of the patterned mask layer is free of the passivation material layer;

removing the patterned mask layer; and planarizing the passivation material layer and the TSV.

13. The manufacturing method of claim 12, wherein forming the passivation material layer comprises:

depositing the passivation material layer on a top surface of the top portion of the patterned mask layer, wherein sidewalls of the top and bottom portions of the patterned mask layer are exposed by the passivation material layer.

14. The manufacturing method of claim 12, wherein removing the patterned mask layer comprises:

performing a lift-off process on the patterned mask layer.

15. The manufacturing method of claim 12, wherein forming the patterned mask layer comprises:

forming the top portion to have a cross-sectional profile tapered toward the bottom portion.

16. The manufacturing method of claim 12, further comprising:

forming a redistribution structure on the first die, the insulating encapsulation, and the TIV after planarizing the passivation material layer and the TSV, wherein the passivation material layer has a higher tensile strength than a dielectric layer of the redistribution structure.

17. The manufacturing method of claim 16, further comprising:

coupling second dies to the redistribution structure, wherein the first die acting as a bridge die is electrically coupled to the second dies through the redistribution structure.

18. A manufacturing method of a semiconductor package, comprising:

forming an insulating encapsulation on a redistribution structure to cover a first die and a through insulation via (TIV) that are disposed on the redistribution structure, wherein the first die comprises a semiconductor substrate and a through substrate via (TSV) embedded in the semiconductor substrate;

recessing a back surface of the semiconductor substrate so that the TSV protrudes above a recessed back surface of the semiconductor substrate; and forming a passivation layer on the recessed back surface of the semiconductor substrate to laterally cover the TSV, wherein a material of the passivation layer has a higher tensile strength than a dielectric layer of the redistribution structure, and top surfaces of the passivation layer, the TSV, the insulating encapsulation, and the TIV are substantially leveled with one another.

19. The manufacturing method of claim 18, wherein forming the passivation layer comprises:

forming a patterned mask layer on the insulating encapsulation and the TIV, wherein an opening of the patterned mask layer exposes the semiconductor substrate and the TSV after recessing the back surface of the semiconductor substrate, and the patterned mask layer comprises a wider top and a narrower bottom;

depositing a passivation material layer on a top surface of the patterned mask layer and the recessed back surface of the semiconductor substrate; and removing the patterned mask layer along with a portion of the passivation material layer deposited on the top surface of the patterned mask layer.

20. The manufacturing method of claim 19, wherein forming the passivation layer comprises:

forming the patterned mask layer to on the insulating encapsulation and the TIV, wherein a portion of the insulating encapsulation adjoining the first die is exposed by the patterned mask layer;

depositing the passivation material layer on the recessed back surface of the semiconductor substrate, wherein the passivation material layer extends to cover the portion of the insulating encapsulation; and removing an excess portion of the passivation material layer, wherein a passivation residue is left on the portion of the insulating encapsulation.

* * * * *